US009076831B2

(12) United States Patent
Drewery

(10) Patent No.: US 9,076,831 B2
(45) Date of Patent: Jul. 7, 2015

(54) SUBSTRATE CLAMPING SYSTEM AND METHOD FOR OPERATING THE SAME

(75) Inventor: John Drewery, Santa Clara, CA (US)

(73) Assignee: Lam Research Corporation, Fremont, CA (US)

(*) Notice: Subject to any disclaimer, the term of this patent is extended or adjusted under 35 U.S.C. 154(b) by 362 days.

(21) Appl. No.: 13/410,243

(22) Filed: Mar. 1, 2012

(65) Prior Publication Data
US 2013/0114181 A1 May 9, 2013

Related U.S. Application Data

(60) Provisional application No. 61/555,677, filed on Nov. 4, 2011.

(51) Int. Cl.
H01L 21/687 (2006.01)
H01L 21/683 (2006.01)
(52) U.S. Cl.
CPC .................. H01L 21/6833 (2013.01)
(58) Field of Classification Search
CPC ............ H01L 21/6833; H01L 21/6831; H01L 21/67109; H02N 13/00; G03F 7/707; G03F 7/70708
USPC ........................................................ 361/234
See application file for complete search history.

(56) References Cited

U.S. PATENT DOCUMENTS

| 4,757,422 | A | * | 7/1988 | Bossard et al. | 361/231 |
| 5,801,915 | A | * | 9/1998 | Kholodenko et al. | 361/234 |
| 5,835,335 | A | * | 11/1998 | Ross et al. | 361/234 |
| 5,933,314 | A | * | 8/1999 | Lambson et al. | 361/234 |
| 6,228,278 | B1 | * | 5/2001 | Winniczek et al. | 216/61 |
| 6,416,822 | B1 | * | 7/2002 | Chiang et al. | 427/561 |
| 6,853,533 | B2 | * | 2/2005 | Parkhe | 361/234 |
| 7,767,561 | B2 | * | 8/2010 | Hanawa et al. | 438/514 |
| 2003/0053283 | A1 | * | 3/2003 | Loo et al. | 361/234 |

OTHER PUBLICATIONS

ISA/US, "International Search Report and Written Opinion" for PCT/US2012/058067, mailed Dec. 17, 2012.

* cited by examiner

Primary Examiner — Jared Fureman
Assistant Examiner — Nicholas Ieva
(74) Attorney, Agent, or Firm — Martine Penilla Group, LLP

(57) ABSTRACT

An electrostatic chuck includes an electrically conductive baseplate and an electrically non-conductive substrate support member disposed on the baseplate. First and second sets of clamp electrodes are disposed within the support member. A power supply system includes a clamp power supply, a center tap power supply, and a baseplate power supply. The clamp power supply generates a positive output voltage and a negative output voltage, each of which is equidistant from a center tap voltage. The positive output voltage is electrically connected to the first set of clamp electrodes. The negative output voltage is electrically connected to the second set of clamp electrodes. The center tap power supply is defined to control the center tap voltage of the clamp power supply. The baseplate power supply is defined to generate a baseplate output voltage independent from the center tap voltage. The baseplate output voltage is electrically connected to the baseplate.

25 Claims, 8 Drawing Sheets

SUBSTRATE CLAMPING SYSTEM AND METHOD FOR OPERATING THE SAME

CLAIM OF PRIORITY

This application claims priority under 35 U.S.C. 119(e) to U.S. Provisional Patent Application No. 61/555,677, filed Nov. 4, 2011, entitled "Substrate Clamping System and Method for Operating the Same," the disclosure of which is incorporated herein by reference in its entirety.

BACKGROUND OF THE INVENTION

In the fabrication of semiconductor devices such as integrated circuits, memory cells, and the like, a series of manufacturing operations are performed to define features on substrates, such as semiconductor wafers. Some manufacturing operations, such as etching and deposition, include plasma processing operations that are performed in a plasma processing chamber in which a process gas is transformed into a plasma comprising reactive constituents that can perform work on the substrate when exposed thereto. During such plasma processing operations, the substrate is held on an electrostatic chuck in exposure to the plasma. The electrostatic chuck is defined to establish an electrostatic field that attracts the substrate to a supporting surface of the electrostatic chuck, thereby securing the substrate to the electrostatic chuck.

Control of the electrostatic field generated by the electrostatic chuck is important for securing the substrate during the plasma processing operations and for safely removing the substrate from the electrostatic chuck upon completion of the plasma processing operations. Control of the electrostatic field generated by the electrostatic chuck can be complicated by radiofrequency currents that may flow through the electrostatic chuck. It is within this context that the present invention arises.

SUMMARY OF THE INVENTION

In one embodiment, a substrate clamping system is disclosed. The substrate clamping system includes an electrostatic chuck that includes a baseplate and a substrate support member disposed on the baseplate. The baseplate is formed of an electrically conductive material. The electrostatic chuck also includes a first set of clamp electrodes disposed within the substrate support member and a second set of clamp electrodes disposed within the substrate support member. The substrate clamping system also includes a power supply system that includes a clamp power supply, a center tap power supply, and a baseplate power supply. The clamp power supply is defined to generate a positive output voltage and a negative output voltage. The positive and negative output voltages are equidistant from a center tap voltage. The positive output voltage is electrically connected to the first set of clamp electrodes. The negative output voltage is electrically connected to the second set of clamp electrodes. The center tap power supply is defined to control the center tap voltage of the clamp power supply. The baseplate power supply is defined to generate a baseplate output voltage independent from the center tap voltage. The baseplate output voltage is electrically connected to the baseplate.

In one embodiment, a power supply system for an electrostatic chuck is disclosed. The power supply system includes a clamp power supply defined to generate a positive output voltage and a negative output voltage. The positive and negative output voltages are equidistant from a center tap voltage. The positive and negative output voltages are transmitted to respective ones of a pair of interleaved clamping electrodes of the electrostatic chuck. The power supply system also includes a center tap power supply defined to control the center tap voltage of the clamp power supply. The power supply system further includes a baseplate power supply defined to generate a baseplate output voltage independent from the center tap voltage. The baseplate output voltage is transmitted to a baseplate of the electrostatic chuck.

In one embodiment, a method is disclosed for operating a substrate clamping system. The method includes an operation for placing a substrate on an electrostatic chuck. The method also includes an operation for generating a center tap voltage. The method also includes an operation for generating a positive clamp voltage and a negative clamp voltage, such that each of the positive and negative clamp voltages is equidistant from the center tap voltage. The method also includes an operation for supplying the positive and negative clamp voltages to respective clamp electrodes within the electrostatic chuck. The method further includes an operation for generating a baseplate voltage independently from generating the center tap voltage. The method also includes an operation for supplying the baseplate voltage to a baseplate of the electrostatic chuck.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
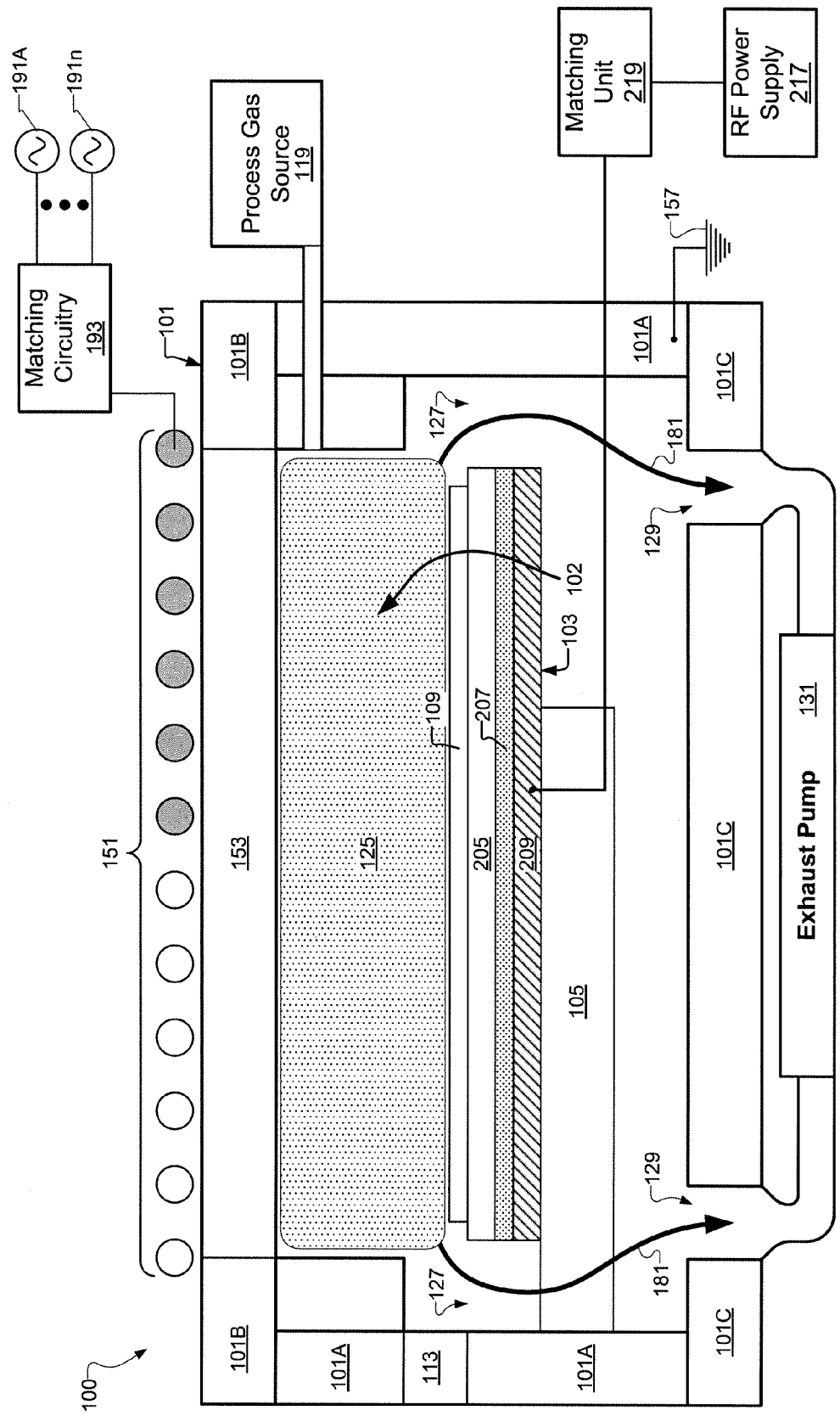
FIG. 1 shows a vertical cross-section of a plasma-driven substrate processing system, in accordance with one embodiment of the present invention.

FIG. 1 shows a vertical cross-section of a plasma-driven substrate processing system 100, in accordance with one embodiment of the present invention. The system 100 includes a chamber 101 formed by a top structure 101B, a bottom structure 101C, and sidewalls 101A extending between the top structure 101B and bottom structure 101C. The chamber 101 encloses a substrate processing region 102 in which a substrate 109 is held in a secured manner on an electrostatic chuck 103 and is exposed to reactive constituents of a plasma 125 formed within the substrate processing region 102. In one embodiment, a door assembly 113 is disposed within the chamber wall 101A to enable insertion and removal of the substrate 109 into/from the chamber 101.

In one embodiment, the term "substrate" as used herein refers to a semiconductor wafer. However, it should be understood that in other embodiments, the term "substrate" as used herein can refer to substrates formed of sapphire, GaN, GaAs or SiC, or other substrate materials, and can include glass panels/substrates, metal foils, metal sheets, polymer materials, or the like. Also, in various embodiments, the "substrate" as referred to herein may vary in form, shape, and/or size. For example, in some embodiments, the "substrate" as referred to herein may correspond to a 200 mm (millimeters) semiconductor wafer, a 300 mm semiconductor wafer, or a 450 mm semiconductor wafer. Also, in some embodiments, the "substrate" as referred to herein may correspond to a non-circular substrate, such as a rectangular substrate for a flat panel display, or the like, among other shapes. The "substrate" referred to herein is denoted in the various example embodiment figures as substrate 109.

In various embodiments, the chamber sidewalls 101A, top structure 101B, and bottom structure 101C can be formed from different materials, such as stainless steel or aluminum, by way of example, so long as the chamber 101 materials are structurally capable of withstanding pressure differentials and temperatures to which they will be exposed during plasma processing, and are chemically compatible with the plasma processing environment. Also, in one embodiment, the chamber sidewalls 101A, top structure 101B, and bottom structure 101C are formed of an electrically conductive material, and are electrically connected to an electrical ground 157.

The substrate processing region 102 is in fluid communication with a process gas source 119. During operation of the system 100, one or more process gases are flowed from the process gas source 119 to the substrate processing region 102. In one embodiment, upon entering the substrate processing region 102, the process gases flow through the substrate processing region 102 to peripheral vents 127, and are pumped out through exhaust ports 129 by an exhaust pump 131, as indicated by arrows 181. In one embodiment, a valve (such as a pendulum valve) can be implemented to throttle the exhaust pump 131 near its input, thereby providing a means for controlling the flow rate of process gases from the substrate processing region 102.

In one embodiment, the substrate processing region 102 is operated within a pressure range extending from about 1 milliTorr (mT) to about 100 mT. For example, in one embodiment, the system 100 is operated to provide a substrate processing region 102 pressure of about 10 mT, with a process gas throughput flow rate of about 1000 sccm/minute (standard cubic centimeters per minute), and with a residence time of the reactive constituents of the plasma 125 within the substrate processing region 102 of about 100 milliseconds (ms). It should be understood and appreciated that the above example operating conditions represent one of an essentially limitless number of operating conditions that can be achieved with the system 100. The above example operating conditions do not represent or imply any limitation on the possible operating conditions of the system 100.

The system 100 also includes a coil assembly 151 disposed to provide power to transform the process gases within the substrate processing region 102 into the plasma 125. In the system 100, the chamber top plate 101B includes a window 153 that is suitable for transmission of RF (radiofrequency) power from the coil assembly 151 into the substrate processing region 102. In one embodiment, the window 153 is formed from quartz. In another embodiment, the window 153 is formed from a ceramic material, such as aluminum oxide. The RF power transmitted from the coil assembly 151 causes the process gases within the substrate processing region 102 to transform into reactive constituents of the plasma 125, including radical constituents and charged specie constituents, e.g., ions. The reactive constituents of the plasma 125 affect processing of the substrate 109. For example, in one embodiment, the reactive constituents of the plasma 125 perform an etching process on the substrate 109.

In one embodiment, RF power is delivered to the coil assembly 151 from one or more RF power sources 191A-191n. Each RF power source 191A-191n is connected through respective matching circuitry 193 to ensure efficient RF power transmission to the coil assembly 151. In the case of multiple RF power sources 191A-191n, it should be understood that each of the multiple RF power sources 191A-191n can be independently controlled with regard to RF power frequency and/or amplitude. In one embodiment, the one or more RF power sources 191A-191n are defined to supply RF power having a frequency of about 13.56 MHz. In other embodiments, the one or more RF power sources 191A-191n are defined to supply RF power having a frequency of about 2 MHz, or about 4 MHz, or about 13.56 MHz, or within a range extending from about 200 kHz to about 400 kHz, or a combination thereof.

It should be understood that the inductive power delivery system of FIG. 1 is shown by way of example. In other embodiments, the system 100 can be defined to generate the plasma 125 in different ways. For example, in one embodiment, the system 100 is defined as a capacitively coupled chamber, in which the substrate processing region 102 is exposed to a pair of spaced apart electrodes that are electrically connected to one or more power supplies, such that power (either direct current (DC), RF, or a combination thereof) is transmitted between the pair of electrodes and through the substrate processing region 102, so as to transform the process gas delivered from the process gas source 119 into the plasma 125. In yet another embodiment, the system 100 is defined as a microwave-driven chamber in which a microwave power source is used to transform the process gas delivered from the process gas source 119 into the plasma 125. Regardless of the particular power delivery embodiment implemented in the system 100 for generation of the plasma 125, it should be understood that during operation of the system 100, process gases supplied by the process gas source 119 are transformed into the plasma 125, such that reactive constituents of the plasma 125 are exposed to the substrate 109 when disposed on the electrostatic chuck 103.

In the example embodiment of system 100 of FIG. 1, the electrostatic chuck 103 is held by a cantilevered arm 105 affixed to a wall 101A of the chamber 101. However, in other embodiments, the electrostatic chuck 103 can be affixed to the bottom plate 101C of the chamber 101 or to another member disposed within the chamber 101. Regardless of the embodiment used to support the electrostatic chuck 103 within the chamber 101, is should be understood that the electrostatic chuck 103 is disposed to support the substrate 109 in exposure to the substrate processing region 102.

In the example embodiment of FIG. 1, the electrostatic chuck 103 includes a baseplate 209 and a substrate support member 205 disposed on the baseplate 209. In one embodiment, the baseplate 209 is formed of an electrically conductive material, such as a metal. In one embodiment, the baseplate 209 is formed of aluminum or an aluminum alloy. In another embodiment, the baseplate 209 is formed of stainless steel. In one embodiment, the baseplate 209 of the electrostatic chuck 103 is connected to receive RF power from an RF power source 217, through a matching unit 219 defined to ensure efficient RF power transmission to the baseplate 209.

In one embodiment, the substrate support member 205 is formed of a ceramic material. In various embodiments, the substrate support member 205 is formed of silicon carbide or aluminum oxide. In one embodiment, the substrate support member 205 is separated from the baseplate 209 by a layer 207 of the electrostatic chuck 103 that includes elastomeric bonds for relaxing thermal stresses between the baseplate 209 and the substrate support member 205. However, it should be understood that in other embodiments, the substrate support member 205 and baseplate 209 can be separated by other suitable materials that will relax thermal stresses therebetween. It should also be understood that in various embodiments, the electrostatic chuck 103 can be formed from different materials, such as stainless steel, aluminum, or ceramic, by way of example, so long as the electrostatic chuck 103 material is structurally capable of withstanding pressure differentials and temperatures to which it will be exposed during plasma processing, and is chemically compatible with the plasma processing environment.

To avoid unnecessarily obscuring the present invention, many features of the electrostatic chuck 103 are not described in detail herein. For example, details of the electrostatic chuck 103 are omitted for clarity with regard to the heating and cooling systems, the backside gas delivery system, the substrate handling system, e.g., substrate lifting pins, and edge rings, among other items.

In one embodiment, the electrostatic chuck 103 is defined to control a temperature of the substrate 109 during performance of plasma processing operations on the substrate 109. In one embodiment, the electrostatic chuck 103 includes a number of cooling channels through which a cooling fluid can be flowed during plasma processing operations to maintain temperature control of the substrate 109. Also, in one embodiment, the electrostatic chuck 103 can include a number of heating elements for increasing the temperature of the substrate 109. It should be understood that each of the layer 207, the baseplate 209, and the substrate support member 205 includes parts of the heating and cooling systems of the electrostatic chuck 103.

Also, in one embodiment, a backside gas, such as helium, is flowed through the backside gas delivery system of the electrostatic chuck 103 to the region between the substrate 109 and the substrate support member 205 of the electrostatic chuck 103 to enhance thermal transfer between the substrate 109 and the electrostatic chuck 103. It should be understood that each of the layer 207, the baseplate 209, and the substrate support member 205 includes parts of the backside gas delivery system of the electrostatic chuck 103.

Figure 2:
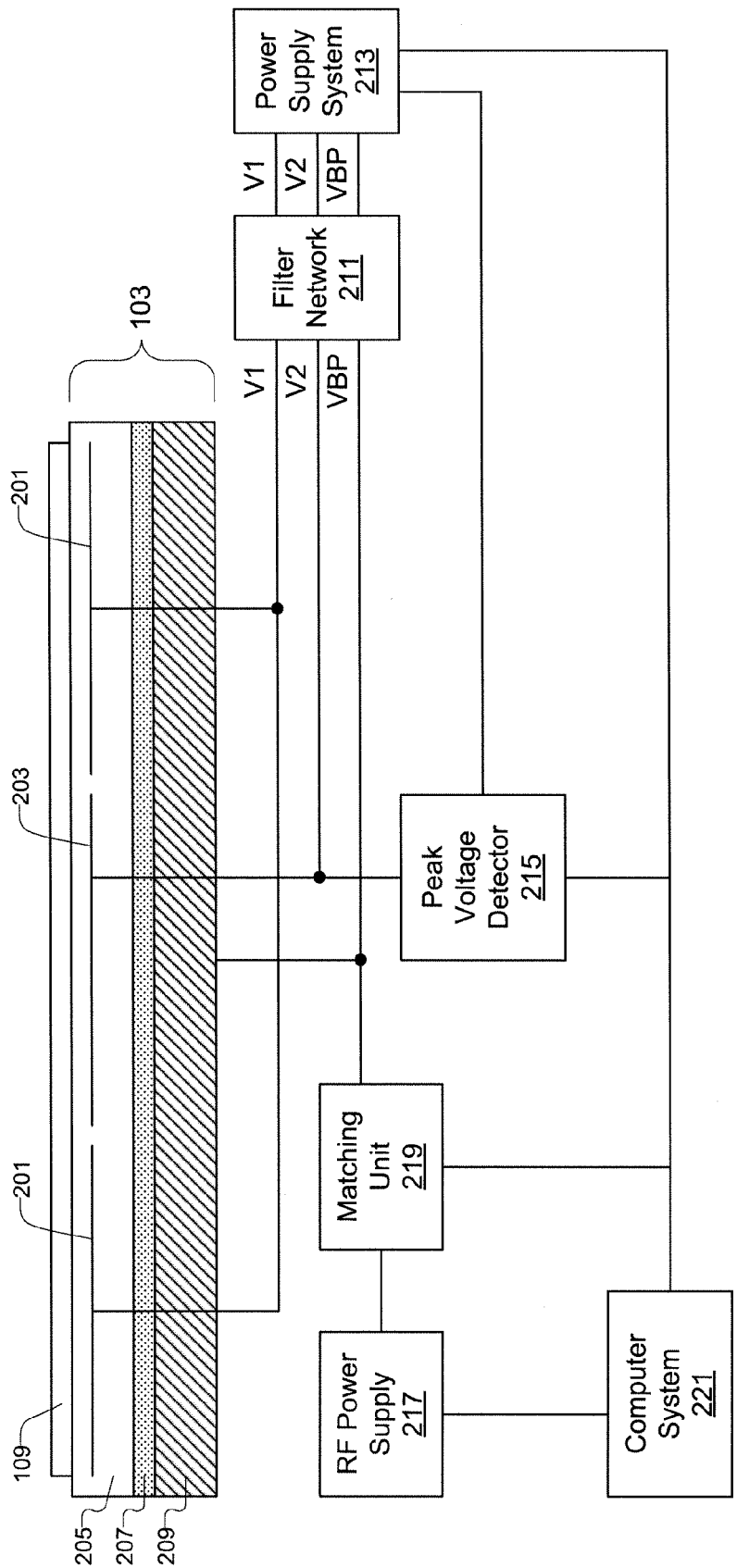
FIG. 2 shows an isolated view of the electrostatic chuck, in accordance with one embodiment of the present invention.

FIG. 2 shows an isolated view of the electrostatic chuck 103, in accordance with one embodiment of the present invention. As previously mentioned, in one embodiment, the baseplate 209 of the electrostatic chuck 103 is connected to receive RF power from the RF power source 217, through the matching unit 219 defined to ensure efficient RF power transmission to the baseplate 209. More specifically, the baseplate 209 is energized with RF power transmitted from the RF power source 217, and the RF power source 217 impedance is matched to the load by the matching unit 219. In this manner, the electrostatic chuck 103 is defined to provide an RF bias to attract ions toward the electrostatic chuck 103, and thereby toward the substrate 109 held on the electrostatic chuck 103. More specifically, the electrostatic chuck 103 is defined to receive and maintain an RF voltage on the baseplate 209 that is capacitively coupled to the substrate 109 through the structure of the electrostatic chuck 103.

During performance of plasma processing operations on the substrate 109, the electrostatic chuck 103 is defined to hold the substrate 109 in a secured manner. In one embodiment, the electrostatic chuck 103 includes a pair of interleaved clamp electrodes 201 and 203 defined to generate an electrostatic field for holding the substrate 109 securely on the electrostatic chuck 103 during plasma processing operations. While the example of FIG. 2 shows a center clamp electrode 203 and an outer clamp electrode 201 for ease of description, it should be understood that in other embodiments each of the pair of interleaved clamp electrodes 201 and 203 can include multiple interleaved electrode segments. Generally speaking, the electrostatic chuck 103 includes a first set of clamp electrodes, e.g., 201, disposed within the substrate support member 205, and a second set of clamp electrodes, e.g., 203, disposed within the substrate support member 205, such that the first and second sets of clamp electrodes are interleaved with each other through an area of the substrate support member 205 over which the substrate 109 is disposed.

The clamp electrodes 201, 203 are electrically connected to receive a DC voltage from a power supply system 213. The power supply system 213 is defined to supply clamp voltages V1 and V2 to respective clamp electrodes 201, 203 through a filter network 211. In one embodiment, the filter network 211 includes separate low pass filtering circuitry for each voltage output by the power supply system 213. In this manner, the low pass filtering circuitry of the filter network 211 protects the power supply system 213 from high frequency RF voltages present at the baseplate 209 and clamp electrodes 201, 203. The power supply system 213 is also defined and connected to supply a DC offset voltage VBP to the baseplate 209. The filter network 211 also includes separate low pass filtering circuitry for the DC offset voltage VBP transmitted to the baseplate 209. Also, as discussed in further detail below, a peak voltage detector 215 is connected to provide a setpoint voltage to the power supply system 213 to control the DC offset voltage VBP applied to the baseplate 209. In one embodiment, the peak voltage detector 215 is defined to measure a peak RF voltage.

Additionally, in one embodiment, a computer system 221 is defined and connected to control the RF power supply 217, the matching unit 219, and the power supply system 213. The computer system 221 is also defined and connected to acquire diagnostic information over multiple analog and/or digital channels with regard to operation of the electrostatic chuck 103, including operation of the RF power supply 217, the matching unit 219, the peak voltage detector 215, and the power supply system 213. The computer system 221 is further defined to provide setpoints to the RF power supply 217, the matching unit 219, and the power supply system 213.

Embodiments are disclosed herein for the power supply system 213 defined to supply the clamp voltages V1 and V2 to the clamp electrodes 201 and 203, respectively, and the DC offset voltage VBP to the baseplate 209. The embodiments for the power supply system 213 are disclosed herein within the context of the electrostatic chuck 103 of Coulomb type, where substrate 109 clamping forces are between a charge present on the clamp electrodes 201, 203 embedded within the substrate support member 205 and a charge present on the substrate 109. However, it should be understood that the power supply system 213 embodiments disclosed herein are equally applicable to an electrostatic chuck of Johnson-Rahbek type, where substrate 109 clamping forces are between a charge present on the surface of the substrate support member 205 and the charge present on the substrate 109.

Clamping forces per unit area in the electrostatic chuck 103 are proportional to a square of an applied voltage as measured from the clamping electrodes 201, 203 to the substrate 109. The clamping force per unit area (F) is calculated as shown in Equation 1, where $\varepsilon$ is a dielectric constant of the material between the substrate 109 and the clamp electrodes 201, 203 (i.e., of the substrate support member 205 material and backside gas if present), d is the thickness of the material between the substrate 109 and the clamp electrodes 201, 203, $V_c = |V - V_w|$, for voltage V on the clamp electrodes 201, 203, and for voltage $V_w$ on the substrate 109, and k is a constant close to 1 that relates to the geometry of the clamp electrodes 201, 203. The substrate voltage $V_w$ is determined by the plasma conditions and by the bias voltage applied to the substrate 109 from the RF power supply 217. When averaged over many cycles of the RF power transmitted from the RF power supply 217, a good approximation of the substrate voltage $V_w$ is given by Equation 2, where $V_p$ is a plasma potential, i.e., the potential of the plasma 125 with reference to FIG. 1, and $V_{pp}$ is the peak-to-peak RF voltage transmitted through the baseplate 109 from the RF power supply 217.

$$F = \frac{k \varepsilon V_c^2}{d^2}. \quad \text{Equation 1}$$

$$V_w = V_p - \frac{V_{pp}}{2}. \quad \text{Equation 2}$$

In a bipolar electrostatic chuck, such as the electrostatic chuck 103, there are two clamp electrodes, e.g., clamp electrodes 201, 203, which are oppositely charged. This bipolar clamp electrode arrangement, when correctly implemented, reduces a total induced charge on the substrate 109 to near zero, which lowers the risk that the substrate 109 will stick to the electrostatic chuck even when the clamping power supply is turned off. For the clamping force between the two clamp electrodes 201, 203, and the substrate 109 to be equal, the clamp voltages $V_1$ and $V_2$ on the two clamp electrodes 201, 203 should satisfy the condition of Equation 3. In other words, for the clamping force between the two clamp electrodes 201, 203, and the substrate 109 to be equal, an average of the clamp voltages $V_1$ and $V_2$ on the two clamp electrodes 201, 203 should be set to the substrate voltage $V_w$. The setting of the two clamp voltages $V_1$ and $V_2$ to the substrate voltage $V_w$ is referred to as "bias compensation."

$$V_1 - V_w = V_w - V_2, \text{ or} \quad \text{Equation 3}$$

$$V_w = \frac{(V_1 + V_2)}{2}.$$

In performing bias compensation, means are used to predict the substrate voltage $V_w$. Then, the average of the clamp voltages $V_1$ and $V_2$ is set to the predicted substrate voltage $V_w$ using the "compensated" electrostatic chuck 103 power supply system 213. If bias compensation is not performed, or is performed incorrectly, clamping forces between the clamp electrodes 201, 203 and the substrate 109 will be unequal and a charge may be induced on the substrate 109 that makes removal of the substrate 109 from the electrostatic chuck 103, i.e., de-chucking, more difficult and increases the risk that a substrate 109 may be damaged during de-chucking. Also, with asymmetric clamping corresponding to unequal clamping forces between the clamp electrodes 201, 203 and the substrate 109, unnecessarily high clamping voltages $V_1$ and $V_2$ may be required.

As mentioned above, a backside gas, such as helium, can be introduced between the substrate 109 and the substrate support member 205 of the electrostatic chuck 103 to improve thermal contact between the substrate 109 and the electrostatic chuck 103. The introduction of backside gas creates a pressure difference across the substrate 109, such that a minimum clamping force is required to hold the substrate 109 in place on the substrate support member 205. Therefore, a minimum clamping voltage $V_{min}$ corresponds to the minimum clamping force required by the pressure differential across the substrate 109 plus a suitable safety margin.

For proper bias compensation of the electrostatic chuck 103, both clamping voltages $V_1$ and $V_2$ can be set such that $V_c$ is approximately equal to the minimum clamping voltage $V_{min}$. Otherwise, however, one of the clamping voltages $V_1$ and $V_2$ must be greater than the minimum clamping voltage $V_{min}$. Having either of the clamping voltages $V_1$ or $V_2$ greater than the minimum clamping voltage $V_{min}$ raises the risks of the substrate 109 sticking to the electrostatic chuck 103 during the de-chucking process, device damage, increased number of particles generated at the interface between the substrate 109 and the substrate support member 205 (because of unnecessary high clamp force at the higher voltage clamp electrode), and electrical arcing to nearby components within the chamber 101.

For an inductively coupled plasma reactor, the plasma potential $V_p$ is close to zero, i.e., positive and usually small compared with the peak-to-peak RF voltage $V_{pp}$ transmitted through the baseplate 109 from the RF power supply 217. Because the plasma potential $V_p$ is positive, Equation 5 sets the baseplate 109 to a voltage that is always lower than the substrate voltage $V_w$. The average substrate voltage $\langle V_w \rangle$ is given by Equation 4. Then, recalling from Equation 3 that the average of the clamp voltages $V_1$ and $V_2$ on the two clamp electrodes 201, 203 should be set to the substrate voltage $V_w$, for an inductively coupled plasma reactor, the average clamp electrode voltage $V_{CT}$ (also referred to as the center tap voltage $V_{CT}$) can be set to minus one-half of the average peak-to-peak RF voltage $\langle V_{pp} \rangle$ transmitted through the baseplate 109 from the RF power supply 217, as shown in Equation 5. Thus, Equation 5 represents the requirement for bias compensation in a plasma processing system where the plasma potential is essentially zero, such as in the inductively coupled plasma reactor. In this instance, the average peak-to-peak RF voltage $\langle V_{pp} \rangle$ is an average of $V_{pp}$ over a suitable period of time. In practice, a low pass filtered value of $V_{pp}$ can be used for the average peak-to-peak RF voltage $\langle V_{pp} \rangle$.

$$\langle V_w \rangle \approx -\frac{\langle V_{pp} \rangle}{2}. \quad \text{Equation 4}$$

$$V_{CT} = \frac{-\langle V_{pp} \rangle}{2}. \quad \text{Equation 5}$$

Another risk associated with electrostatic chuck operation is electrical arcing between the baseplate 209 and substrate 109, or between the baseplate 109 and nearby components within the chamber 101. This phenomena is referred to as "baseplate arcing." It should be understood that baseplate arcing can occur when the metallic baseplate 209, which is powered by the RF power supply 217, becomes momentarily positively charged with respect to the plasma 125. Baseplate arcing results in damaging discharges that limit the operational lifetime of the electrostatic chuck 103 and create particulates that can contaminate the substrate 109. To prevent baseplate arcing, the baseplate 209 potential ($V_{bp}$), i.e., baseplate voltage $V_{bp}$, is set as shown in Equation 6 using a high voltage power supply within the power supply system 213. In Equation 6, the function max($V_{pp}$) refers to the maximum $V_{pp}$ over a suitable time scale. Thus, according to Equation 6, the baseplate voltage $V_{bp}$ is controlled to be substantially equal to minus one-half of a maximum peak-to-peak voltage of the supplied RF power transmitted through the baseplate 109 from the RF power supply 217. In other words, the baseplate voltage $V_{bp}$ is controlled to be substantially equal to the most positive value of the RF voltage applied to the baseplate 109. It should be understood that the baseplate voltage $V_{bp}$ is set such that the peak RF voltage on the baseplate 209 is maintained either equal to or less than the plasma potential.

$$V_{bp} = -\max\left(\frac{V_{pp}}{2}\right). \quad \text{Equation 6}$$

When the baseplate bias voltage ($V_{bp}$) is at a constant level for a long time compared with the timescale over which the average peak-to-peak RF voltage $\langle V_{pp} \rangle$ and maximum peak-to-peak RF voltage (max($V_{pp}$)) are determined, then the average peak-to-peak RF voltage $\langle V_{pp} \rangle$ becomes substantially equal to the maximum peak-to-peak RF voltage (max($V_{pp}$)). In this case, the baseplate bias voltage $V_{bp}$ can be set equal to the average clamp electrode voltage $V_{CT}$, i.e., $V_{bp}=V_{CT}$, and both the requirement for electrostatic chuck 103 bias compensation (Equation 5) and the requirement for baseplate 109 arcing (Equation 6) will be satisfied. Therefore, in the embodiment in which the average peak-to-peak RF voltage $\langle V_{pp} \rangle$ is substantially equal to the maximum peak-to-peak RF voltage (max($V_{pp}$)) over a long time period, the power supply system 213 can be defined to supply the baseplate bias voltage $V_{bp}$ substantially equal to the average clamp electrode voltage $V_{CT}$ (i.e., substantially equal to the center tap voltage $V_{CT}$).

Figure 3:
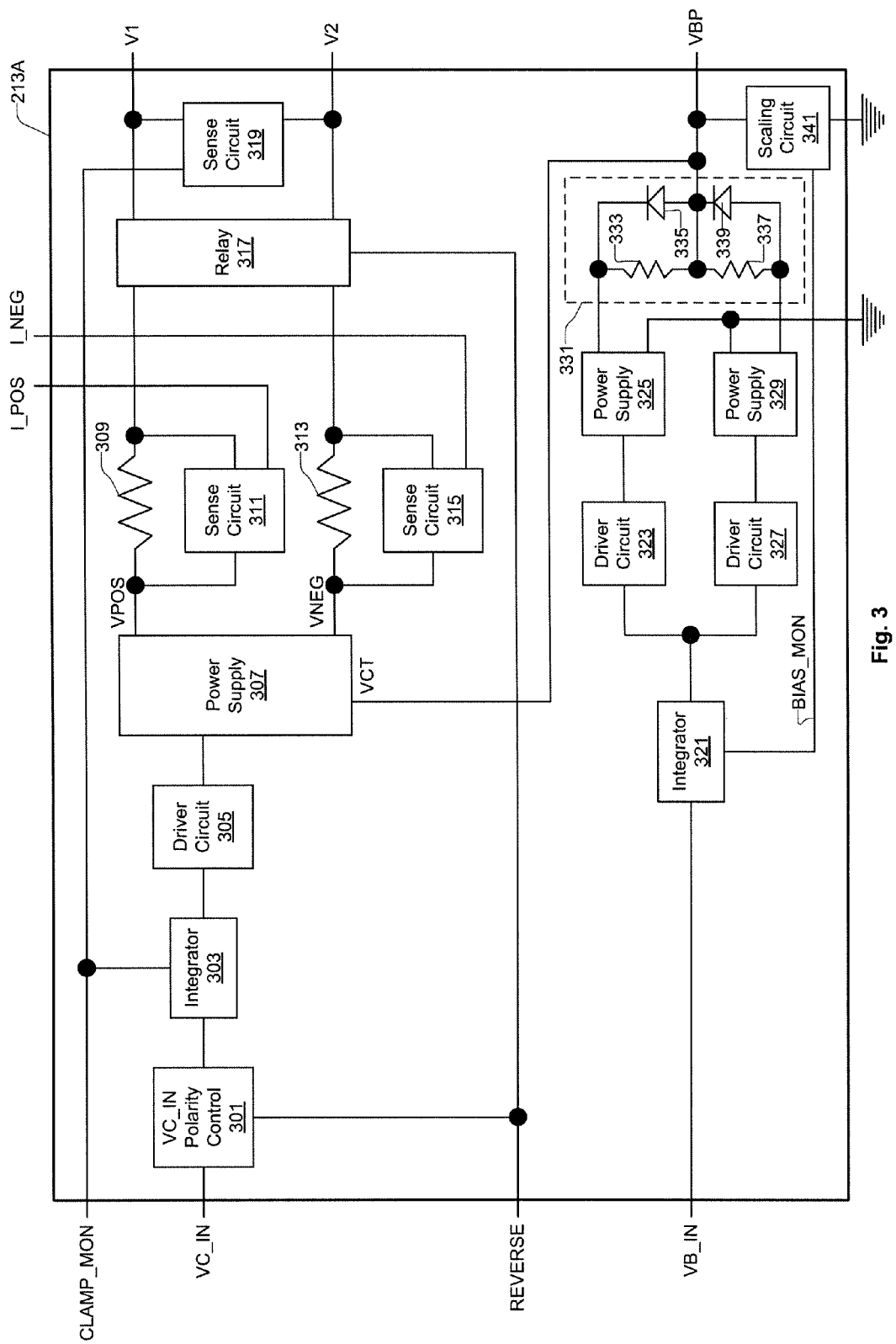
FIG. 3 shows a schematic of a power supply system defined to supply the baseplate bias voltage $V_{bp}$ equal to the average clamp electrode voltage $V_{CT}$, in accordance with one embodiment of the present invention.

FIG. 3 shows a schematic of a power supply system 213A defined to supply the baseplate bias voltage $V_{bp}$ equal to the average clamp electrode voltage $V_{CT}$, in accordance with one embodiment of the present invention. For clarity, internal grounds and internal power supplies are not shown in the schematic of FIG. 3. Also, for clarity, circuit blocks that perform simple level shifting and amplification operations are not shown in the schematic of FIG. 3.

A clamp electrode setpoint voltage signal proportional to a desired difference between the clamp electrode voltages ($V_1$−$V_2$) is set at an input VC_IN. A baseplate 209 DC offset setpoint voltage signal is set at an input VB_IN. In one embodiment, the baseplate 209 DC offset setpoint voltage signal at the input VB_IN is provided from the peak voltage detector 215 as a measured peak RF voltage equivalent to $V_{pp}/2$.

The baseplate bias voltage $V_{bp}$ is provided at an output VBP. The baseplate bias voltage $V_{bp}$ provided at VBP is sensed by a scaling circuit 341, which in turn provides a baseplate bias voltage output monitoring signal BIAS_MON as an input to an integrator 321. The integrator 321 operates to compare the signal BIAS_MON with the baseplate 209 DC offset setpoint voltage received at the input VB_IN to generate a baseplate offset error signal. The integrator 321 further operates to generate an integrated version of the baseplate offset error signal. The integrated version of the baseplate offset error signal is used to drive a pair of isolated high voltage power supplies 325 and 329 via high power operational amplifiers 323 and 327, respectively. In one embodiment, the high voltage power supplies 325 and 329 are defined and connected to provide a bias output voltage between positive 2000 Volts and negative 2000 Volts (with reference to a ground potential) to a sense circuit 331. The sense circuit 331 is a network of resistors 333, 337 and diodes 335, 339 that provides for four-quadrant operation, i.e., provides the capability to source or sink current regardless of the polarity of the output.

An output of the sense circuit 331 is connected to the baseplate bias voltage $V_{bp}$ output VBP. The output of the sense circuit 331 is also connected to a center tap position VCT of a power supply 307. In this manner, the baseplate bias voltage $V_{bp}$ at the output VBP is equal to the center tap voltage $V_{CT}$ at the center tap position VCT of the power supply 307, which is equal to the average clamp electrode voltage. Therefore, the power supply system 213A is defined to supply the baseplate bias voltage $V_{bp}$ equal to the average clamp electrode voltage $V_{CT}$, for situations in which the average peak-to-peak RF voltage $\langle V_{pp} \rangle$ is substantially equal to the maximum peak-to-peak RF voltage (max($V_{pp}$)) over a long time period.

In one embodiment, the power supply 307 is an isolated bipolar high voltage power supply 307. In this embodiment, the power supply 307 is driven by a clamp voltage feedback loop and provides an isolated positive output voltage VPOS and an isolated negative output voltage VNEG, such that each of the positive output voltage VPOS and the negative output voltage VNEG is equidistant from the center tap voltage $V_{CT}$ at the center tap position VCT of the power supply 307, i.e., VPOS−$V_{CT}$=$V_{CT}$−VNEG. In one embodiment, the supply 307 is driven by high voltage operational amplifier 305, which receives an input signal from an integrator circuit 303.

The outputs voltages VPOS and VNEG of the power supply 307 are electrically connected to a first clamp electrode voltage output V1 and a second clamp electrode voltage output V2 of the power supply system 213A. The outputs V1 and V2 are electrically connected to the clamp electrodes 201 and 203, such that the output voltages VPOS and VNEG present at the outputs V1 and V2 are applied to the clamp electrodes 201 and 203 as clamp electrode voltages $V_1$ and $V_2$. In one embodiment, in route to the outputs V1 and V2, the outputs VPOS and VNEG of the power supply 307 are connected to current sensing resistors 309 and 313, respectively. The voltage difference across each of the current sensing resistors 309 and 313 is measured and processed by sense circuits 311 and 315, respectively, to provide current monitoring signals I_POS and I_NEG, respectively, representing the measured output currents at the two clamp electrode voltage outputs V1 and V2.

A sense circuit 319 is electrically connected to the two clamp electrode voltage outputs V1 and V2. The sense circuit 319 is defined to generate and output a clamp voltage monitoring signal (CLAMP_MON) proportional to the voltage difference between the two outputs V1 and V2, i.e., proportional to VPOS−VNEG. The integrator circuit 303 receives the clamp voltage monitoring signal CLAMP_MON as an input from the sense circuit 319. The integrator circuit 303 is defined to subtract the clamp voltage monitoring signal CLAMP_MON from the clamp electrode setpoint voltage signal received at the input VC_IN to form a clamp error signal. The integrator 303 further operates to generate an integrated version of the clamp error signal. The integrated version of the clamp error signal is used to drive the power supply 307 via the high power operational amplifier 305. In this manner, transmission of the clamp voltage monitoring signal CLAMP_MON from the sense circuit 310 to the integrator 303 provides the clamp voltage feedback loop mentioned above.

In one embodiment, the power supply system 213A is defined to enable switching of the polarity of the clamp voltages $V_1$ and $V_2$ that are applied to the clamp electrodes 201 and 203. To implement this polarity switching capability, the power supply system 213A includes a relay 317 and VC_IN polarity control circuit 301, which each receive a polarity reversal control signal at an input REVERSE. During operation, the output voltages VPOS and VNEG are transmitted from the current sensing resistors 309 and 313 to the relay 317. If the input signal received at the REVERSE input indicates no polarity reversal, then the relay 317 connects the positive output voltage VPOS to the output V1, and connects the negative output voltage VNEG to the output V2, considering that V1 and V2 are normally expected to be positive and negative, respectively.

In a corresponding manner, if the input signal received at the REVERSE input indicates that a polarity reversal is to be performed, then the relay 317 connects the positive output voltage VPOS to the output V2, and connects the negative output voltage VNEG to the output V1, again considering that V1 and V2 are normally expected to be positive and negative, respectively. Because the output of sense circuit 319 reverses polarity when the REVERSE input signal is asserted, the VC_IN polarity control circuit 301 is defined to reverse the polarity of the clamp electrode setpoint voltage signal received at the input VC_IN when the REVERSE input signal is asserted.

It should be understood that the power supply system 213 of FIG. 3 is defined to set the baseplate bias voltage $V_{bp}$ equal to the average clamp electrode voltage $V_{CT}$, which is acceptable when the average peak-to-peak RF voltage $\langle V_{pp} \rangle$ is substantially equal to the maximum peak-to-peak RF voltage $(\max(V_{pp}))$ over a long time period. However, if the peak-to-peak RF voltage $V_{pp}$ varies over the time scale that is used to calculate the average peak-to-peak RF voltage $\langle V_{pp} \rangle$ and maximum peak-to-peak RF voltage $(\max(V_{pp}))$, then $\langle V_{pp} \rangle$ and $\max(V_{pp})$ can be very different.

Figure 4:
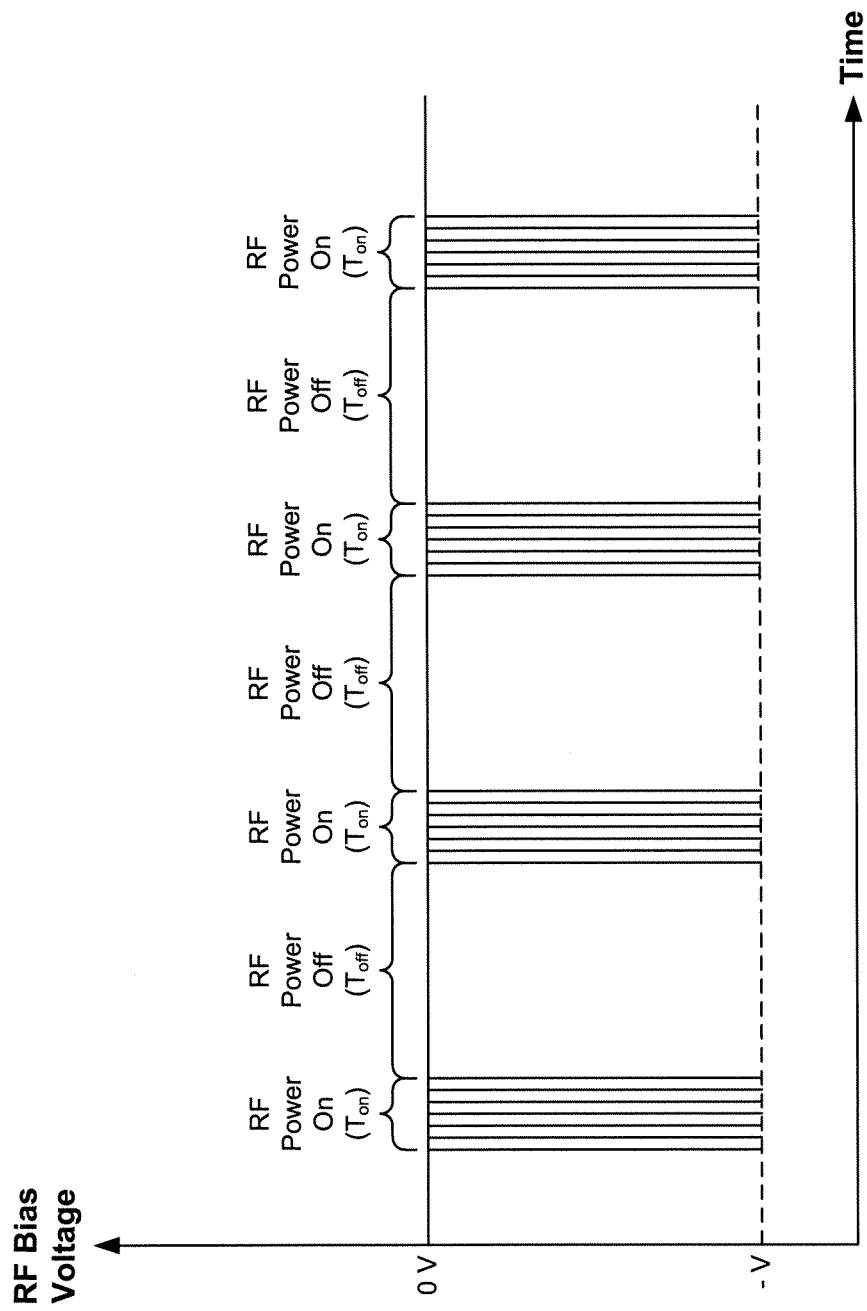
FIG. 4 shows a chart of pulsed RF power generation by the RF power supply as a function of time, in accordance with one embodiment of the present invention.

For example, FIG. 4 shows a chart of pulsed RF power generation by the RF power supply 217 as a function of time, in accordance with one embodiment of the present invention. In the pulsed RF power generation embodiment, the RF power supply 217 is operated to generate and transmit RF power to the baseplate 209 in a pulsed manner, such that each RF pulse lasts for a duration $T_{on}$, and such that successive RF pulses are separated by duration $T_{off}$ in which no RF power is generated. It should be appreciated that when the RF bias voltage is pulsed, as shown in FIG. 4, the average peak-to-peak RF voltage $\langle V_{pp} \rangle$ is calculated as shown in Equation 7, and the maximum peak-to-peak RF voltage $(\max(V_{pp}))$ is calculated as shown in Equation 8.

In the pulsed RF power embodiment, the compensation voltages $V_{bp}$ and $V_{CT}$ may be significantly different. Therefore, it is not acceptable in this embodiment to have the baseplate bias voltage $V_{bp}$ equal to the average clamp electrode voltage $V_{CT}$, by way of connection to a common electrical node as discussed above with regard to the power supply system 213A. Thus, when pulsed RF power is supplied to the baseplate 209 from the RF power supply 217, it is necessary to have independent control of the baseplate bias voltage $V_{bp}$ and the average clamp electrode voltage $V_{CT}$ (i.e., the center tap voltage of the power supply 307).

$$\langle V_{pp} \rangle = aV \qquad \text{Equation 7.}$$

$$\max(V_{pp}) = V \qquad \text{Equation 8.}$$

Figure 5:
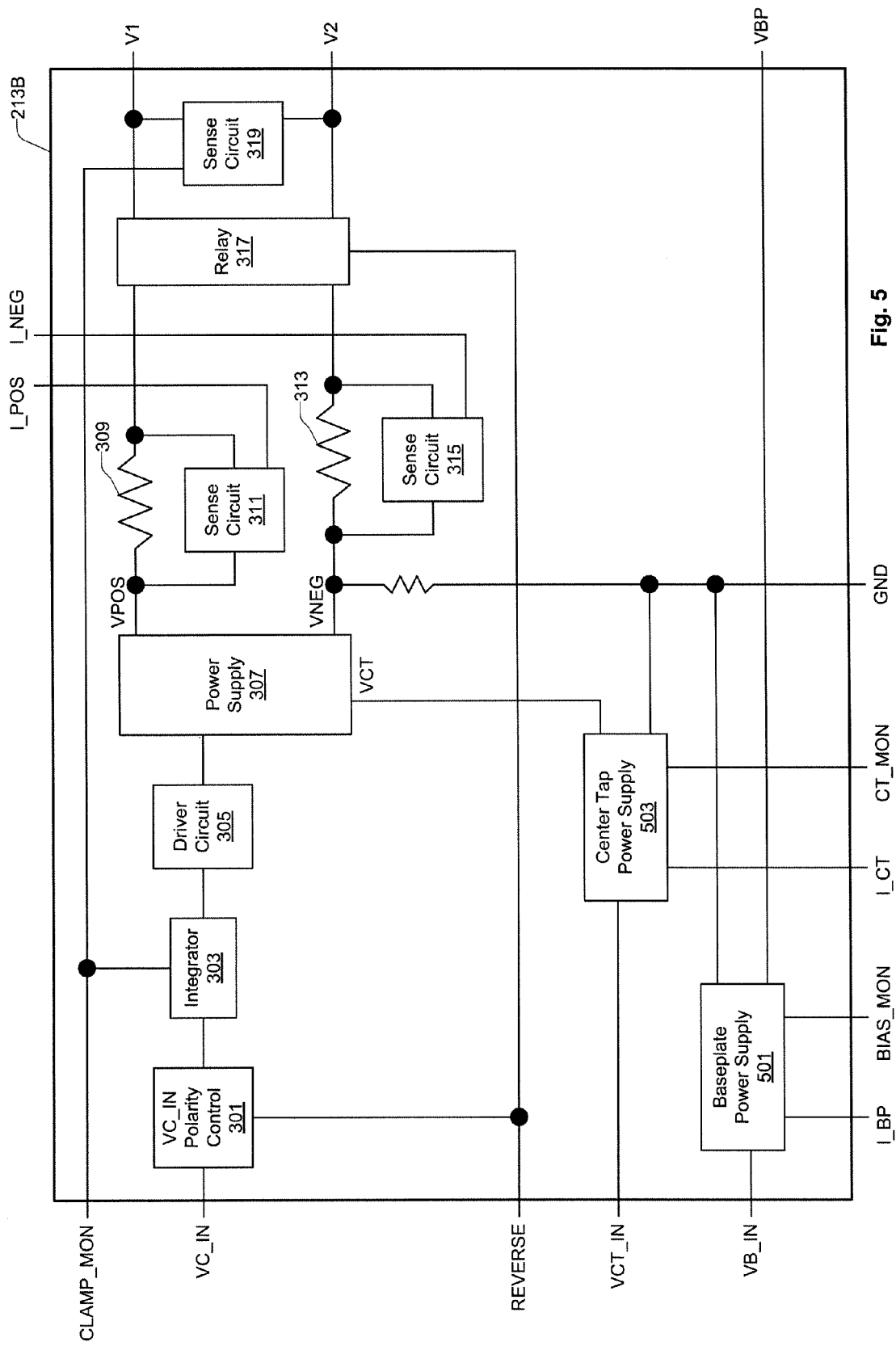
FIG. 5 shows a schematic of a power supply system defined to provide independent control of the baseplate bias voltage $V_{bp}$ supply and the average clamp electrode voltage $V_{CT}$ (i.e., center tap voltage of the power supply), in accordance with one embodiment of the present invention.

FIG. 5 shows a schematic of a power supply system 213B defined to provide independent control of the baseplate bias voltage $V_{bp}$ supply and the average clamp electrode voltage $V_{CT}$ (i.e., center tap voltage of the power supply 307), in accordance with one embodiment of the present invention. For clarity, internal grounds and internal power supplies are not shown in the schematic of FIG. 5. Also, for clarity, circuit blocks that perform simple level shifting and amplification operations are not shown in the schematic of FIG. 5.

As shown in FIG. 5, the power supply system 213B implements a clamp voltage supply chain similar to described above with regard to the power supply system 213A of FIG. 3. Specifically, the power supply system 213B implements the power supply 307, the driver circuit 305, the integrator 303, the resistors 309 and 313, the sense circuits 311 and 315, the sense circuit 319, the relay 317, and the VC_IN polarity control 301. Also, as described above with regard to the power supply system 213A, the power supply system 213B is defined to receive the clamp electrode setpoint voltage signal at the input VC_IN and output the clamp voltage monitoring signal CLAMP_MON and current monitoring signals I_POS and I_NEG, in addition to supplying the two clamp electrode voltage outputs V1 and V2.

In one embodiment, the power supply 307 in the power supply system 213B is defined as a symmetric dual-output isolated high voltage power supply 307. In one embodiment, the power supply 307 in the power supply system 213B is defined as an isolated high voltage switching power supply 307. In one embodiment, the clamp voltage supply chain of the power supply system 213B receives the clamp electrode setpoint voltage signal at the input VC_IN within a range extending from 0 Volt to about positive 10 Volts, and generates an isolated output voltage at VPOS within a range extending from 0 Volt to about positive 3000 Volts, and generates an isolated output voltage at VNEG within a range extending from 0 Volt to about negative 3000 Volts, where both VPOS and VNEG are measured relative to the center tap voltage $V_{CT}$ at the center tap position VCT of the power supply 307. Also, in one embodiment, a maximum output current out of VPOS is about negative 1 milliAmp, and a maximum output current out of VNEG is about 1 milliAmp. It should be understood, however, that the above-mentioned voltage and current ranges for VPOS and VNEG are provided for one exemplary embodiment. Other embodiments may implement a power supply 307 defined to generate voltages and currents at VPOS and VNEG that are outside of the ranges disclosed above for the example embodiment.

It should be understood that an output voltage difference VCLAMP (VCLAMP=V1−V2) of the power supply 307 is programmable by way of the clamp electrode setpoint voltage signal at the input VC_IN. Specifically, in one embodiment, the computer system 221 is defined and connected to allow setting of the clamp electrode setpoint voltage signal at the input VC_IN to obtain an output voltage difference VCLAMP within a range extending from 0 Volt to a maximum value VCLAMP_MAX, where VCLAMP_MAX is within a range extending from about 2000 Volts to about 10000 Volts. In one embodiment, VCLAMP_MAX is about 6000 Volts. In one embodiment, the clamp electrode setpoint voltage signal provided at the input VC_IN is an analog signal having a voltage within a range extending from 0 Volt to positive 10 Volts, or having a current within a range extending from about 4 milliAmps to about 20 milliAmps. Also, in one embodiment, the clamp electrode setpoint voltage signal provided at the input VC_IN can be derived from one or more digital inputs. For example, a serial interface such as RS232, Ethernet, CAN, DeviceNet, LonWorks, or similar interface, may be used in conjunction with ASIC, FPGA, DSP, or microcontroller based circuitry, among others, to generate the clamp electrode setpoint voltage input signal in response to commands received over the serial interface.

In a similar manner, in various embodiments, the monitoring signals CLAMP_MON, I_POS, and I_NEG, can be returned to the controlling computer system 221 as analog voltages or currents, or over a digital interface after analog-to-digital conversion using ASIC, FPGA, DSP or microcontroller based circuitry. In one embodiment, the monitoring signals CLAMP_MON, I_POS, and I_NEG are generated as analog voltages within a range extending from about negative 10 Volts to about positive 10 Volts. Also, it should be understood that additional monitoring signals beyond CLAMP_MON, I_POS, and I_NEG can be provided by suitable circuitry defined and connected within the clamp voltage supply chain.

The power supply system 213B also includes a center tap power supply 503 defined to control the center tap voltage $V_{CT}$ of the clamp power supply 307. The power supply system 213B also includes a baseplate power supply 501 defined to generate the baseplate bias voltage $V_{bp}$ (i.e., baseplate output voltage $V_{bp}$) at the output VBP independent from the center tap voltage $V_{CT}$. As discussed above, output VBP is electrically connected to the baseplate 209, thereby providing the baseplate bias voltage $V_{bp}$ to the baseplate 209. It should be understood that the baseplate power supply 501 is defined separate from the center tap power supply 503, and the baseplate power supply 501 is defined to operate independent from the center tap power supply 503. It should be understood that the power supply system 213B provides for correctly biasing both the baseplate 209 and the clamping electrodes 201, 203 of the electrostatic chuck 103, by providing separate and independent control the baseplate output voltage $V_{bp}$ and the center tap voltage $V_{CT}$.

The center tap power supply 503 includes an output electrically connected to the center tap position VCT of the clamp power supply 307 such that the center tap voltage $V_{CT}$ generated and output by the center tap power supply 503 is applied to the center tap position VCT of the clamp power supply 307. In one embodiment, the center tap power supply 503 is defined to generate the center tap voltage $V_{CT}$ within a range extending from 0 Volt to about negative 5000 Volts.

The center tap power supply 503 is defined to receive a center tap voltage input control signal VCT_IN indicating the center tap voltage $V_{CT}$ to be generated and output by the center tap power supply 503. In various embodiments, the VCT_IN control signal is generated by low pass filtering of the peak-to-peak RF voltage $V_{pp}$ measured by the peak voltage detector 215, or by operating the computer system 221 to compute the VCT_IN control signal based on the measured peak-to-peak RF voltage $V_{pp}$.

In one embodiment, the computer system 221 is defined and connected to allow setting of the center tap voltage input control signal VCT_IN to direct the center tap power supply 503 to generate the center tap voltage $V_{CT}$ within a range extending from 0 Volt to a maximum value VCT_MAX, where VCT_MAX is within a range extending from about negative 100 Volts to about negative 5000 Volts. In one embodiment, VCT_MAX is about negative 2000 Volts. In one embodiment, the center tap voltage input control signal VCT_IN is an analog signal having a voltage within a range extending from 0 Volt to positive 10 Volts, or having a current within a range extending from about 4 milliAmps to about 20 milliAmps. Also, in one embodiment, the center tap voltage input control signal VCT_IN can be derived from one or more digital inputs. For example, a serial interface such as RS232, Ethernet, CAN, DeviceNet, LonWorks, or similar interface, may be used in conjunction with ASIC, FPGA, DSP, or microcontroller based circuitry, among others, to generate the center tap voltage input control signal VCT_IN in response to commands received over the serial interface.

In one embodiment, the center tap power supply 503 is defined to output a center tap current monitoring signal I_CT and a center tap voltage monitoring signal CT_MON. In one embodiment, the center tap power supply 503 includes a current monitor which can be used to detect an imbalance between the electrical currents at the positive and negative clamp electrodes 201, 203 of the electrostatic chuck 103. In one embodiment, a sensitivity of the current monitor within the center tap power supply 503 can be selected by digital inputs so as to increase a dynamic range of current that can be measured.

In various embodiments, the monitoring signals I_CT and CT_MON, can be returned to the controlling computer system 221 as analog voltages or currents, or over a digital interface after analog-to-digital conversion using ASIC, FPGA, DSP or microcontroller based circuitry. In one embodiment, the monitoring signals I_CT and CT_MON are generated as analog voltages within a range extending from about negative 10 Volts to about positive 10 Volts. Also, it should be understood that additional monitoring signals beyond I_CT and CT_MON can be provided by suitable circuitry defined and connected within the center tap power supply 503.

In various embodiments, the center tap power supply 503 and/or the baseplate power supply 501 can have four-quadrant outputs. More specifically, the center tap power supply 503 and/or the baseplate power supply 501 can be defined to both source and sink electrical current regardless of the polarity of their output voltage. However, power supplies with four-quadrant outputs are generally expensive and large. In most practical cases, it is sufficient that the outputs of the center tap power supply 503 and baseplate power supply 501 are negative with respect to ground. This is because the substrate voltage $V_w$ does not become significantly positive with respect to ground during the plasma processing operations. Therefore, in one embodiment, a unipolar, negative output, power supply can be used for each of the center tap power supply 503 and baseplate power supply 501.

Compact, inexpensive, negative voltage power supplies typically have little or no current sourcing capability. Therefore, use of the unipolar, negative output, center tap power supply 503 may be problematic when the center tap power supply 503 needs to source electrical current through its output. For example, if an imbalance exists between the currents at the VPOS and VNEG outputs of the power supply 307, this current imbalance must be compensated by the center tap power supply 503. This current imbalance between the VPOS and VNEG outputs of the power supply 307 may be positive or negative, corresponding to the current flowing into or out of the center tap position VCT. If the center tap power supply 503 can only sink current, but cannot source current (as in the case of a unipolar, negative output, center tap power supply 503), then the center tap power supply 503 will not be able to control its output when a negative current is needed to compensate for current imbalance at the VPOS and VNEG outputs of the power supply 307.

In order to handle the current sourcing limitation of the unipolar, negative output, center tap power supply 503, the power supply system 213B is defined to deliberately unbalance the currents between the VPOS and VNEG outputs of the power supply 307, such that center tap power supply 503 will not be called upon to source current to the center tap position VCT. To unbalance the currents between the VPOS and VNEG outputs of the power supply 307, the power supply system 213B implements connection of a large bias resistor 505 between the VNEG output of the power supply 307 and ground GND. In other words, the bias resistor 505 is electrically connected between a terminal of the clamp power supply 307 at which the negative output voltage VNEG is generated and a ground reference potential GND, so as to induce a bias current between the center tap position VCT of the clamp power supply 307 and the output of the center tap power supply 503.

If the output currents at the VPOS and VNEG outputs of the clamp power supply 307 are equal, a bias current will flow at the center tap position VCT of clamp power supply 307. The output will then be correct provided that $i_{POS}-i_{NEG}<i_B$, where $i_{POS}$ is the current out of the VPOS output, $i_{NEG}$ is the current out of the VNEG output, and $i_B$ is the bias current given by Equation 9, where $V_{CT}$ is the center tap voltage output by the center tap power supply 503, $V_{CLAMP}=V_1-V_2$, and R is the resistance value of the bias resistor 505.

$$i_B = \frac{\left(V_{CT} - \frac{V_{CLAMP}}{2}\right)}{R}. \qquad \text{Equation 9}$$

In one embodiment, the bias resistor 505 can have a resistance value within a range extending from about 10 kiloOhms to about 1000 megaOhms. In one embodiment, the bias resistor 505 has a resistance value of about 50 megaOhms. Use of the bias resistor 505 with the resistance value of about 50 megaOhms allows for a bias current $i_B$ within a range extending from about 10 microAmps to about 50 microAmps, depending on operating conditions. It should be appreciated that current biasing of the center tap power supply 503 through use of the bias resistor 505 is advantageous in that it avoids the need to use a higher voltage center tap power supply and more complex feedback circuitry, as is done in the power supply system 213A of FIG. 3. Also, it should be understood that in one embodiment, the bias resistor 505 may be replaced by an appropriately defined active load, such as a device that provides an electric current that is independent of voltage over a large range of voltage.

As previously mentioned, the baseplate power supply 501 is defined to generate the baseplate output voltage $V_{bp}$ independent from the center tap voltage $V_{CT}$, where the baseplate output voltage $V_{bp}$ is provided at an output VBP that is electrically connected to the baseplate 209. It should be appreciated that the baseplate power supply 501 is defined separate from the center tap power supply 503, and that the baseplate power supply 501 is defined to operate independent from the center tap power supply 503. Therefore, in the power supply system 213B, the baseplate output voltage $V_{bp}$ is not electrically connected to the center tap voltage $V_{CT}$. Also, as previously mentioned, the baseplate power supply 501 can be defined to have a four-quadrant output in one embodiment. However, in another embodiment, the baseplate power supply 501 is defined as a unipolar, negative output, power supply, i.e., as a single-quadrant output power supply. Under normal circumstances, use of the unipolar, negative output, baseplate power supply 501 is sufficient, as any DC current will flow into the output of this baseplate power supply 501.

The baseplate power supply 501 is defined to receive a baseplate voltage input control signal VB_IN indicating the baseplate output voltage $V_{bp}$ to be generated and output by the baseplate power supply 501. In various embodiments, the VB_IN control signal is provided from an external sample/hold circuit that samples the maximum value of the peak-to-peak RF voltage $V_{pp}$ as measured by the peak voltage detector 215 during an RF pulse cycle, but may be provided as a computed output from the computer system 221. In one embodiment, the baseplate power supply 501 includes feedback circuitry that allows setting of the baseplate output voltage $V_{bp}$ by a voltage input which is derived from VB_IN.

In one embodiment, the computer system 221 is defined and connected to allow setting of the baseplate voltage input control signal VB_IN to direct the baseplate power supply 501 to generate the baseplate output voltage $V_{bp}$ within a range extending from 0 Volt to a maximum value VBIAS_MAX, where VBIAS_MAX is within a range extending from about negative 100 Volts to about negative 5000 Volts. In one embodiment, VBIAS_MAX is about negative 2000 Volts. In one embodiment, the baseplate voltage input control signal VB_IN is an analog signal having a voltage within a range extending from 0 Volt to 10 Volts, or having a current within a range extending from about 4 milliAmps to about 20 milliAmps. Also, in one embodiment, the baseplate voltage input control signal VB_IN can be derived from one or more digital inputs. For example, a serial interface such as RS232, Ethernet, CAN, DeviceNet, LonWorks, or similar interface, may be used in conjunction with ASIC, FPGA, DSP, or microcontroller based circuitry, among others, to generate the baseplate voltage input control signal VB_IN in response to commands received over the serial interface.

In one embodiment, the baseplate power supply 501 is defined to output a baseplate current monitoring signal I_BP and a baseplate voltage monitoring signal BIAS_MON. In one embodiment, the baseplate power supply 501 is defined to include a current sensing component that provides a measure of the electrical current I_BP at the baseplate bias voltage output VBP, and thus a measure of the electrical current supplied to the baseplate 209. It should be appreciated that the I_BP signal can be used to characterize and monitor operation of the electrostatic chuck 103. In one embodiment, a sensitivity of the current monitor within the baseplate power supply 501 can be selected by digital inputs so as to increase a dynamic range of current that can be measured.

In various embodiments, the monitoring signals I_BP and BIAS_MON, can be returned to the controlling computer system 221 as analog voltages or currents, or over a digital interface after analog-to-digital conversion using ASIC, FPGA, DSP or microcontroller based circuitry. In one embodiment, the monitoring signals I_BP and BIAS_MON are generated as analog voltages within a range extending from about negative 10 Volts to about positive 10 Volts. Also, it should be understood that additional monitoring signals beyond I_BP and BIAS_MON can be provided by suitable circuitry defined and connected within the baseplate power supply 501.

Figure 6:
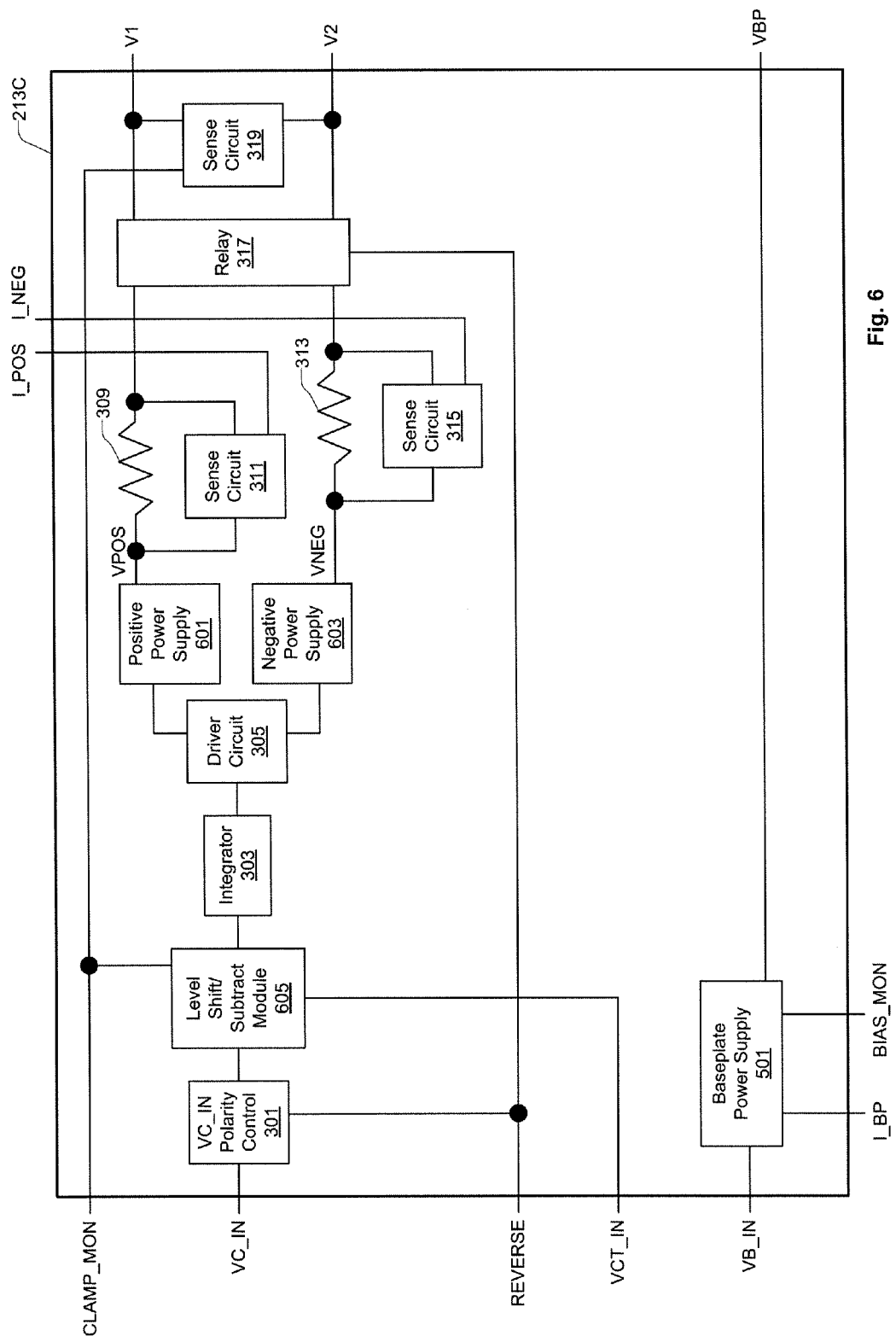
FIG. 6 shows a schematic of a power supply system 213C that is a variation of the power supply system 213B of FIG. 5, in accordance with one embodiment of the present invention.

FIG. 6 shows a schematic of a power supply system 213C that is a variation of the power supply system 213B of FIG. 5, in accordance with one embodiment of the present invention.

As with the power supply system 213B of FIG. 5, the power supply system 213C of FIG. 6 is also defined to provide independent control of the baseplate bias voltage $V_{bp}$ supply relative the clamp electrode voltage outputs V1 and V2. However, in contrast to the power supply system 213B of FIG. 5, the power supply system 213C of FIG. 6 utilizes two separate independently controllable power supplies 601 and 603 in lieu of the single power supply 307 and its associated center tap power supply 503. In the power supply system 213C, the VCT_IN input signal is directed to a level shift/subtract module 605, which is electrically connected between the polarity control circuit 301 and the integrator circuit 303. By way of the VCT_IN control signal, the level shift/subtract module 605 provides for control of the VPOS and VNEG outputs of the positive power supply 601 and negative power supply 603, respectively.

It should be understood that each of the positive power supply 601 and the negative power supply 603 can be independently set such that they are equidistant in voltage from a central voltage setting that is similar to a center tap voltage, although there is no center tap power supply in the power supply system 213C. In one embodiment, the positive power supply 601 is defined to have a bipolar, four quadrant capability. In another embodiment, both the positive power supply 601 and the negative power supply 603 are defined to have a bipolar, four quadrant capability. It should also be understood that the baseplate power supply 501 is defined and operated separate from the positive power supply 601 and the negative power supply 603.

Figure 7:
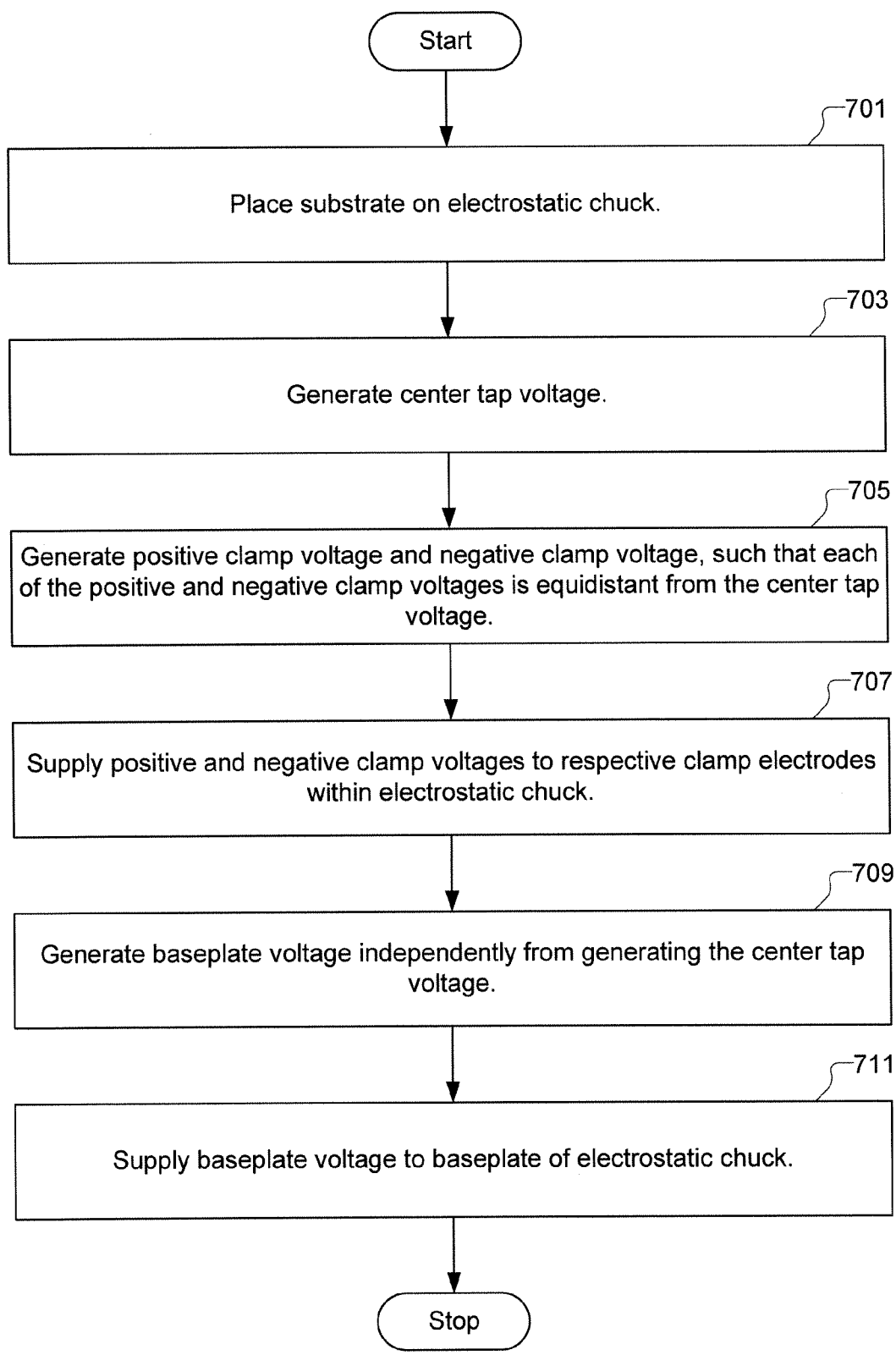
FIG. 7 shows a flowchart of a method for operating a substrate clamping system, in accordance with one embodiment of the present invention.

FIG. 7 shows a flowchart of a method for operating a substrate clamping system, in accordance with one embodiment of the present invention. It should be understood that the method of FIG. 7 can be implemented using the power supply system 213B of FIG. 5. The method includes an operation 701 for placing a substrate 109 on an electrostatic chuck 103. The method also includes an operation 703 for generating a center tap voltage $V_{CT}$. The method also includes an operation 705 for generating a positive clamp voltage VPOS and a negative clamp voltage VNEG, such that each of the positive clamp voltage VPOS and the negative clamp voltage VNEG is equidistant from the center tap voltage $V_{CT}$. The method also includes an operation 707 for supplying the positive clamp voltage VPOS and the negative clamp voltage VNEG to respective clamp electrodes 201, 203 within the electrostatic chuck 103. The method further includes an operation 709 for generating a baseplate voltage $V_{bp}$ independently from generating the center tap voltage $V_{CT}$. The method also includes an operation 711 for supplying the baseplate voltage $V_{bp}$ to a baseplate 209 of the electrostatic chuck 103.

In one embodiment, the center tap voltage $V_{CT}$ is generated by a center tap power supply 503. Also, in this embodiment the positive clamp voltage VPOS and the negative clamp voltage VNEG are generated by a clamp power supply 307 at respective positive and negative output terminals of the clamp power supply 307. Also, in one embodiment, the method includes an operation for transmitting the center tap voltage $V_{CT}$ from an output of the center tap power supply 503 to a center tap position VCT of the clamp power supply 307. Also, in one embodiment, the method includes an operation for inducing an electric current at the negative output terminal of the clamp power supply 307 to cause a bias current $i_B$ to flow at the output of the center tap power supply 503 so as to prevent the center tap power supply 503 from needing to source current.

In one embodiment, the method includes an operation for supplying RF power to the baseplate 209 of the electrostatic chuck 103. In one embodiment, the RF power is supplied to the baseplate 209 in a pulsed manner. In another embodiment, the RF power is supplied to the baseplate 209 is a substantially continuous manner. The method can also include an operation for controlling the baseplate voltage $V_{bp}$ to be substantially equal to minus one-half of a maximum peak-to-peak voltage of the supplied RF power $V_{pp}$. The method can also include an operation for controlling the center tap voltage $V_{CT}$ to be substantially equal to minus one-half of an average peak-to-peak voltage of the supplied RF power $V_{pp}$. In the method, the baseplate voltage $V_{bp}$ and the center tap voltage $V_{CT}$ are generated and controlled independently from each other.

Figure 8:
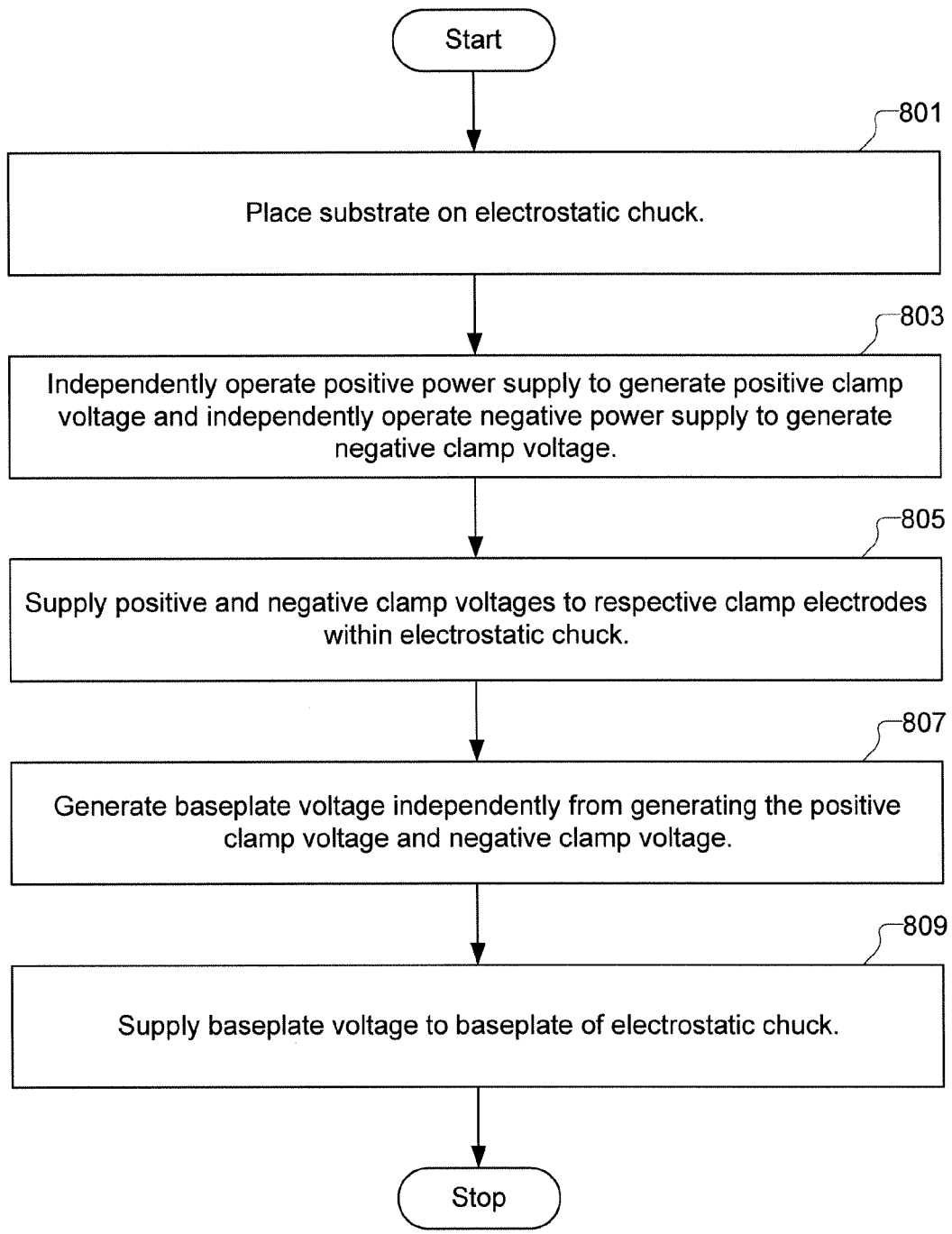
FIG. 8 shows a flowchart of a method for operating a substrate clamping system, in accordance with one embodiment of the present invention.

FIG. 8 shows a flowchart of a method for operating a substrate clamping system, in accordance with one embodiment of the present invention. It should be understood that the method of FIG. 8 can be implemented using the power supply system 213C of FIG. 6. The method includes an operation 801 for placing a substrate 109 on an electrostatic chuck 103. The method also includes an operation 803 for independently operating a positive power supply to generate a positive clamp voltage VPOS and independently operating a negative power supply to generate a negative clamp voltage VNEG, such that each of the positive clamp voltage VPOS and the negative clamp voltage VNEG is equidistant from a central voltage setting (as set by VCT_IN). The method also includes an operation 805 for supplying the positive clamp voltage VPOS and the negative clamp voltage VNEG to respective clamp electrodes 201, 203 within the electrostatic chuck 103. The method further includes an operation 807 for generating a baseplate voltage $V_{bp}$ independently from generation of the positive clamp voltage VPOS and negative clamp voltage VNEG. The method also includes an operation 809 for supplying the baseplate voltage $V_{bp}$ to a baseplate 209 of the electrostatic chuck 103.

While this invention has been described in terms of several embodiments, it will be appreciated that those skilled in the art upon reading the preceding specification and studying the drawings will realize various alterations, additions, permutations and equivalents thereof. The present invention includes all such alterations, additions, permutations, and equivalents as fall within the true spirit and scope of the invention.

What is claimed is:

1. A substrate clamping system, comprising:
    an electrostatic chuck including a baseplate and a substrate support member disposed on the baseplate, the baseplate formed of an electrically conductive material, the electrostatic chuck including a first set of clamp electrodes disposed within the substrate support member and a second set of clamp electrodes disposed within the substrate support member;
    a power supply system including a clamp power supply, a center tap power supply, and a baseplate power supply, the clamp power supply defined to generate a positive output voltage and a negative output voltage, the positive and negative output voltages equidistant from a center tap voltage, the positive output voltage electrically connected to the first set of clamp electrodes, the negative output voltage electrically connected to the second set of clamp electrodes, the center tap power supply defined to control the center tap voltage of the clamp power supply, the baseplate power supply defined to generate a baseplate output voltage independent from the center tap voltage, the baseplate output voltage electrically connected to the baseplate; and
    a bias resistor electrically connected between a terminal of the clamp power supply at which the negative output voltage is generated and a ground reference potential.

2. A substrate clamping system as recited in claim 1, wherein the baseplate power supply is defined separate from the center tap power supply, and wherein the baseplate power supply is defined to operate independent from the center tap power supply.

3. A substrate clamping system as recited in claim 1, wherein the center tap power supply includes an output electrically connected to a center tap position of the clamp power supply such that the center tap voltage generated and output by the center tap power supply is applied to the center tap position of the clamp power supply.

4. A substrate clamping system as recited in claim 1, wherein the center tap power supply is defined to generate the center tap voltage within a range extending from 0 Volt to about negative 5000 Volts.

5. A substrate clamping system as recited in claim 1, wherein the center tap power supply is defined as a unipolar power supply defined to generate and output a negative center tap voltage.

6. A substrate clamping system as recited in claim 5, wherein the bias resistor induces a bias current between the center tap position of the clamp power supply and the output of the center tap power supply.

7. A substrate clamping system as recited in claim 6, wherein the bias resistor has an electrical resistance within a range extending from about 10 kiloOhms to about 1000 megaOhms.

8. A substrate clamping system as recited in claim 6, wherein the bias current is within a range extending from about 10 microAmps to about 50 microAmps.

9. A substrate clamping system as recited in claim 5, wherein a terminal of the clamp power supply at which the negative output voltage is generated is electrically connected to a device that provides an electric current that is substantially independent of voltage.

10. A substrate clamping system as recited in claim 1, wherein the baseplate power supply is defined to generate the baseplate output voltage within a range extending from 0 Volt to about negative 5000 Volts.

11. A substrate clamping system as recited in claim 1, wherein the baseplate power supply is defined as a unipolar power supply defined to generate and output a negative baseplate voltage.

12. A substrate clamping system as recited in claim 1, wherein the clamp power supply is defined to generate a clamping voltage within a range extending from 0 Volt to about 10000 Volts, wherein the clamping voltage is a voltage difference between the positive output voltage and the negative output voltage.

13. A substrate clamping system as recited in claim 1, wherein the clamp power supply is defined to receive a clamp voltage input control signal indicating a clamping voltage to be generated by the clamp power supply, wherein the clamping voltage is a voltage difference between the positive output voltage and the negative output voltage, and wherein the center tap power supply is defined to receive a center tap voltage input control signal indicating the center tap voltage to be generated and output by the center tap power supply, and wherein the baseplate power supply is defined to receive a baseplate voltage input control signal indicating the baseplate output voltage to be generated and output by the baseplate power supply.

14. A substrate clamping system as recited in claim 13, wherein the center tap power supply is defined to output a center tap current monitoring signal and a center tap voltage monitoring signal, and wherein the baseplate power supply is defined to output a baseplate current monitoring signal and a baseplate voltage monitoring signal.

15. A substrate clamping system as recited in claim 14, further comprising:
a computer system defined to generate and transmit input signals including the clamp voltage input control signal, the center tap voltage input control signal, and the baseplate voltage input control signal, the computer system further defined to receive and process monitoring signals including the center tap current monitoring signal, the center tap voltage monitoring signal, the baseplate current monitoring signal, and the baseplate voltage monitoring signal, the computer system defined to maintain appropriate settings of the input signals based on the monitoring signals.

16. A substrate clamping system as recited in claim 1, further comprising:
a radiofrequency power supply electrically through matching circuitry to the baseplate to enable supply of radiofrequency power to the baseplate.

17. A power supply system for an electrostatic chuck, comprising:
a clamp power supply defined to generate a positive output voltage and a negative output voltage, the positive and negative output voltages equidistant from a center tap voltage, the positive and negative output voltages to be transmitted to respective ones of a pair of interleaved clamping electrodes of the electrostatic chuck;
a center tap power supply defined to control the center tap voltage of the clamp power supply;
a baseplate power supply defined to generate a baseplate output voltage independent from the center tap voltage, the baseplate output voltage to be transmitted to a baseplate of the electrostatic chuck; and
a bias resistor electrically connected between a terminal of the clamp power supply at which the negative output voltage is to be generated and a ground reference potential.

18. A power supply system for an electrostatic chuck as recited in claim 17, wherein the baseplate power supply is defined separate from the center tap power supply, and wherein the baseplate power supply is defined to operate independent from the center tap power supply.

19. A power supply system for an electrostatic chuck as recited in claim 17, wherein the center tap power supply includes an output electrically connected to a center tap position of the clamp power supply such that the center tap voltage generated and output by the center tap power supply is applied to the center tap position of the clamp power supply.

20. A power supply system for an electrostatic chuck as recited in claim 17, wherein the center tap power supply is defined as a unipolar power supply defined to generate and output a negative center tap voltage, wherein the baseplate power supply is defined as a unipolar power supply defined to generate and output a negative baseplate voltage.

21. A power supply system for an electrostatic chuck as recited in claim 20, wherein the bias resistor is configured to induce a bias current between the center tap position of the clamp power supply and the output of the center tap power supply.

22. A method for operating a substrate clamping system, comprising:
  placing a substrate on an electrostatic chuck;
  generating a center tap voltage;
  generating a positive clamp voltage and a negative clamp voltage, such that each of the positive and negative clamp voltages is equidistant from the center tap voltage;
  supplying the positive and negative clamp voltages to respective clamp electrodes within the electrostatic chuck;
  generating a baseplate voltage independently from generating the center tap voltage;
  supplying the baseplate voltage to a baseplate of the electrostatic chuck,
  wherein the center tap voltage is generated by a center tap power supply, and wherein the positive and negative clamp voltages are generated by a clamp power supply at respective positive and negative output terminals of the clamp power supply;
  transmitting the center tap voltage from an output of the center tap power supply to a center tap position of the clamp power supply; and
  inducing an electric current at the negative output terminal of the clamp power supply by using a bias resistor connected between the negative output terminal of the clamp power supply and a ground reference potential.

23. A method for operating a substrate clamping system as recited in claim 22, further comprising:
  wherein the induced electric current at the negative output terminal of the clamp power supply causes a bias current to flow at the output of the center tap power supply so as to prevent the center tap power supply from needing to source current.

24. A method for operating a substrate clamping system as recited in claim 22, further comprising:
  supplying radiofrequency power to the baseplate of the electrostatic chuck.

25. A method for operating a substrate clamping system as recited in claim 24, further comprising:
  controlling the baseplate voltage to be substantially equal to minus one-half of a maximum peak-to-peak voltage of the supplied radiofrequency power; and
  controlling the center tap voltage to be substantially equal to minus one-half of an average peak-to-peak voltage of the supplied radiofrequency power,
  wherein the baseplate voltage and the center tap voltage are controlled independently from each other.

* * * * *